United States Patent
Lee et al.

(10) Patent No.: US 7,504,266 B2
(45) Date of Patent: Mar. 17, 2009

(54) MAGNETIC TUNNEL JUNCTION STRUCTURES AND METHODS OF FABRICATION

(75) Inventors: Kyu-Mann Lee, Suwon (KR); Hyun-Jo Kim, Hwasung (KR); Jeong-Hee Park, Gwangmyeong (KR); Tae-Wan Kim, Euwang (KR); I-Hun Song, Seongnam (KR); Seok-Jae Chung, Seongnam (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 141 days.

(21) Appl. No.: 11/141,057

(22) Filed: Jun. 1, 2005

(65) Prior Publication Data

US 2005/0207219 A1    Sep. 22, 2005

Related U.S. Application Data

(62) Division of application No. 10/376,633, filed on Mar. 3, 2003, now Pat. No. 6,952,364.

(51) Int. Cl.
  *H01L 21/00* (2006.01)
(52) U.S. Cl. .................. 438/3; 257/E21.665; 365/171; 365/173; 365/158; 365/225.5
(58) Field of Classification Search .............. 438/3; 257/30, 295, E21.665; 365/171, 173, 158, 365/225.5
See application file for complete search history.

(56) References Cited

U.S. PATENT DOCUMENTS

| | | | |
|---|---|---|---|
| 5,841,692 A * | 11/1998 | Gallagher et al. ........... 365/173 |
| 6,130,814 A | 10/2000 | Sun | |
| 6,163,477 A | 12/2000 | Tran | |
| 6,165,803 A | 12/2000 | Chen et al. | |
| 6,208,492 B1 | 3/2001 | Pinarbasi | |
| 6,331,944 B1 * | 12/2001 | Monsma et al. ............. 365/171 |
| 6,341,053 B1 * | 1/2002 | Nakada et al. ........... 360/324.2 |
| 6,385,082 B1 | 5/2002 | Abraham et al. | |
| 6,385,083 B1 | 5/2002 | Shama et al. | |
| 6,399,521 B1 | 6/2002 | Zhang et al. | |

(Continued)

FOREIGN PATENT DOCUMENTS

EP    1 376 602 A2    1/2004

(Continued)

OTHER PUBLICATIONS

Slaughter et al., "Magnetic Tunnel Junction Materials for Electronic Applications", JOM-e, vol. 52, No. 6, 2000.*

(Continued)

*Primary Examiner*—Jerome Jackson, Jr.
*Assistant Examiner*—Jay C Kim
(74) *Attorney, Agent, or Firm*—Harness, Dickey & Pierce P.L.C.

(57) ABSTRACT

A method for forming an MTJ structure suitable for use in a MRAM device having a bottom electrode including a layer of platinum, ruthenium, iridium, rhodium, osmium, palladium or their oxides and having reduced surface roughness to improve the hysteresis loop characteristics of the resulting MTJ structure. The bottom electrode layer may also combine the functions of both the seeding layer and bottom electrode of the conventional two-layer structure, thereby simplifying the manufacturing process.

6 Claims, 6 Drawing Sheets

U.S. PATENT DOCUMENTS

| | | | |
|---|---|---|---|
| 6,420,740 B1 | 7/2002 | Zhang et al. | |
| 6,430,085 B1 | 8/2002 | Rizzo | |
| 6,454,956 B1* | 9/2002 | Engelhardt et al. | 216/53 |
| 6,490,139 B1* | 12/2002 | Hayashi et al. | 360/322 |
| 6,509,621 B2 | 1/2003 | Nakao | |
| 6,545,906 B1 | 4/2003 | Savtchenko et al. | |
| 6,548,849 B1 | 4/2003 | Pan et al. | |
| 6,555,428 B2* | 4/2003 | Jung | 438/239 |
| 6,560,135 B2 | 5/2003 | Matsuoka et al. | |
| 6,590,244 B2 | 7/2003 | Asao et al. | |
| 6,603,677 B2 | 8/2003 | Redon et al. | |
| 6,603,678 B2 | 8/2003 | Nickel et al. | |
| 6,608,738 B2* | 8/2003 | Sakakima et al. | 360/324.11 |
| 6,703,654 B1* | 3/2004 | Horng et al. | 257/295 |
| 6,703,864 B2 | 3/2004 | Takeuchi et al. | |
| 6,720,597 B2 | 4/2004 | Janesky et al. | |
| 6,724,674 B2 | 4/2004 | Abraham et al. | |
| 6,744,651 B2 | 6/2004 | Tang | |
| 6,756,237 B2* | 6/2004 | Xiao et al. | 438/3 |
| 6,762,953 B2 | 7/2004 | Tanizaki et al. | |
| 6,771,534 B2 | 8/2004 | Stipe | |
| 6,791,874 B2 | 9/2004 | Tran et al. | |
| 6,952,364 B2 | 10/2005 | Lee et al. | |
| 7,141,842 B2 | 11/2006 | Kajiyama | |
| 2002/0048128 A1* | 4/2002 | Kamiguchi et al. | 360/324.1 |
| 2002/0075631 A1* | 6/2002 | Singh et al. | 361/311 |
| 2002/0114113 A1 | 8/2002 | Lederman et al. | |
| 2002/0141231 A1 | 10/2002 | Komori | |
| 2002/0176277 A1 | 11/2002 | Bessho et al. | |
| 2002/0191451 A1* | 12/2002 | Kishi et al. | 365/200 |
| 2002/0196657 A1 | 12/2002 | Katoh | |
| 2003/0072109 A1* | 4/2003 | Sharma et al. | 360/324.2 |
| 2003/0122174 A1* | 7/2003 | Fukuzumi | 257/306 |
| 2003/0170976 A1 | 9/2003 | Molla et al. | |
| 2004/0012895 A1* | 1/2004 | Drewes et al. | 360/324.1 |
| 2004/0129361 A1* | 7/2004 | Chen et al. | 156/58 |
| 2004/0137645 A1* | 7/2004 | Hu et al. | 438/3 |
| 2005/0078510 A1 | 4/2005 | Jeong et al. | |
| 2007/0206411 A1 | 9/2007 | Lee et al. | |
| 2007/0230242 A1 | 10/2007 | Lee et al. | |

FOREIGN PATENT DOCUMENTS

| | | |
|---|---|---|
| JP | H10-177705 | 6/1998 |
| JP | 2000-188435 | 7/2000 |
| JP | 2000-260959 | 9/2000 |
| JP | 2001-084757 | 3/2001 |
| JP | 2001-084758 | 3/2001 |
| JP | 2001-250206 | 9/2001 |
| JP | 2002-319664 | 10/2002 |
| JP | 2002-359356 | 12/2002 |
| JP | 2004-087519 | 3/2004 |
| KR | 10-2001-0034414 | 4/2001 |
| KR | 10-2001-0100817 | 11/2001 |
| KR | 10-2002-0008919 | 2/2002 |
| KR | 10-2002-0046036 | 6/2002 |
| KR | 10-2003-0040027 | 5/2003 |
| KR | 10-2004-0003479 | 1/2004 |
| KR | 10-2004-0026619 | 3/2004 |
| KR | 10-2004-0038420 | 5/2004 |
| WO | WO 00/04551 | 1/2000 |
| WO | WO 03/092014 A1 | 11/2003 |
| WO | WO 03/094170 A2 | 11/2003 |
| WO | WO 2004/049344 | 6/2004 |

OTHER PUBLICATIONS

Jeong et al., "Fully Integrated 64Kb MRAM with Novel Reference Cell Scheme", Electron Devices Meeting, 2002. IEDM '02. Digest. International, vol., Iss., 2002, pp. 551-554.*

Office Action for corresponding Korean Application No. 10-2003-0034186 dated May 7, 2005.

Jeong et al. "Fully Integrated 64Kb MRAM with Novel Reference Cell Scheme." Electron Devices Meeting, 2002. IEDM '02. Digest. International, vol., Iss., 2002, pp. 551-554.

Boeck et al. "Spintronics, a New Nanoelectronics Adventure" thinfilmmfg.com 5 pages (2002) http://www.thinfilmmfg.com/subscribers/Subscriber02/spin1May02.htm Accessed online May 20, 2005.

Deak "Spin Injection in Thermally Assisted Megnetic Random Access Memory" 15 pages http://www.nve.com/advpdf/49th_MMM_spin_injection_TA_MRAM.pdf Accessed online Jun. 20, 2005.

Fert et al. "The New Era of Spintronics" *Europhysics News* 34(6) 7 pages (2003) http://www.europhysicsnews.com/full/24/article9/article9.html Accessed online Jun. 20, 2005.

Johnson "Magnetic Spin Locks data into MRAMs" *EETimes Online* (Jul. 17, 2001) 4 pages http://www.eetimes.com/story/OEG20010717S0064 Accessed online Apr. 18, 2005.

Translation of an Office Action issued by German Patent and Trademark Office Feb. 16, 2006 for 10-2004-043-264-3-33.

Office Action issued by Korean Intellectual Property Office for Korean Application No. 10-2004-0062635 on Mar. 16, 2006.

* cited by examiner

(Conventional MRAM)

MAGNETIC TUNNEL JUNCTION STRUCTURES AND METHODS OF FABRICATION

This is a divisional of application Ser. No. 10/376,633, filed Mar. 3, 2003, now U.S. Pat. No. 6,952,364, the entire contents of which are incorporated by reference.

BACKGROUND OF THE INVENTION

1. Field of the Invention

The present invention relates to magnetic tunnel junction structures suitable for use in magnetic random access memory (MRAM) cells and methods of fabricating such structures, particularly with respect to the bottom electrode of such structures.

2. Description of the Related Art

Semiconductor memory devices for storing data can generally be categorized as either volatile memory devices or nonvolatile memory devices. Volatile memory devices are those that lose the stored data when their power supplies are interrupted while nonvolatile memory devices are those that retain the stored data even when their power supplies are interrupted. Accordingly, nonvolatile memory devices including flash, static random access memory (SRAM), ferroelectric random access memory (FeRAM) and magnetic random access memory (MRAM) devices have been used in memory cards, mobile telecommunication systems and other electronic devices for maintaining stored data while reducing power consumption.

A conventional MRAM device comprises a plurality of memory cells employing magnetic tunnel junction (MTJ) structures. FIG. 1 provides a cross-sectional view of a conventional MRAM cell having such a MTJ structure.

Referring to FIG. 1, the conventional MRAM cell comprises a MTJ structure 16 including a bottom electrode 1, a seeding layer 3, a pinning layer pattern 5, a pinned layer pattern 7, a tunneling layer pattern 9, a free layer pattern 11, a capping layer pattern 13 and a top electrode 15, which are sequentially stacked. A digit line 17 is disposed under and electrically insulated from the bottom electrode 1. A bit line 19 is positioned over and in electrical contact with the top electrode 15 and is arranged generally perpendicular to the digit line 17.

In the conventional MRAM cell, the bottom electrode 1 may be a stacked structure including both a titanium layer and a titanium nitride layer. The titanium layer is typically used as a wetting layer for improving the adhesion between the titanium nitride layer and the insulating layer under the titanium layer. The seeding layer 3 is typically a NiFe layer and is used for controlling the crystalline orientation of the pinning layer pattern 5. The pinned layer pattern 7 and the free layer pattern 11 are formed of an anti-ferromagnetic layer and a ferromagnetic layer, respectively. During operation of the MRAM cell, the pinned layer pattern 7 acts as a magnetic reference layer while the free layer pattern 11 acts as a magnetically changeable layer.

The pinning layer pattern 5 determines the magnetization direction of the pinned layer pattern 7, but does not exert a similar influence on the magnetization direction of the free layer pattern 11. The free layer pattern 11 may, instead, be selectively magnetized by current flowing through the digit line 17 during a write operation. When the magnetization direction of the free layer pattern 11 is parallel or substantially parallel to that of the pinned layer pattern 7, the tunneling layer pattern 9 will exhibit a relatively low resistance value. However, when the magnetization direction of the free layer pattern 11 is antiparallel or substantially antiparallel to that of the pinned layer pattern 7, the tunneling layer pattern 9 will exhibit a relatively high resistance value. Accordingly, the MRAM cell may be read by applying a read voltage to the bit line 19 and sensing the bit line current that flows through the tunneling layer pattern 9 and the bottom electrode 1.

Aluminum oxide layer has been widely used in formation of the tunneling layer pattern 9. When aluminum oxide is used in this manner, the layer thickness is generally maintained at 30 Å or less in order to obtain better tunneling characteristics. The tunneling layer should also have a smooth surface without any pinholes or other defects to provide improved reliability. The tunneling layer should also have a generally uniform thickness across the entire wafer in order to produce MRAM devices having consistent performance. Because the magnetic resistance of an aluminum oxide tunneling layer is exponentially proportional to its thickness, variations in the layer thickness produce even wider and undesired variations in the magnetic resistance.

A bottom electrode 1 formed from a titanium nitride layer as described above tends to exhibit poor surface morphology with a high degree of surface roughness. When the bottom electrode exhibits a poor surface morphology, the aluminum oxide layer formed above also tends to exhibit a similar poor surface morphology, i.e., a high surface roughness, as a result of the condition of the titanium nitride layer. Further, the pinning layer pattern 5 and the pinned layer pattern 7 formed over the bottom electrode may also tend to have surfaces that exhibit a similar degree of surface roughness. When the pinning layer pattern has a rough surface, the net magnetization of the pinned layer pattern 7 will be reduced and tend to degrade the hysteresis loop characteristics of the resulting MTJ structure.

BRIEF SUMMARY OF THE INVENTION

Exemplary embodiments of the invention provide a method for forming an improved MTJ structure suitable for use in a MRAM device having an improved bottom electrode that provides reduced surface roughness. The improved bottom electrode utilizes a single layer that combines both the seeding layer function and bottom electrode function of the conventional two-layer structure.

BRIEF DESCRIPTION OF THE DRAWINGS

The advantages and scope of the present invention will further disclosed through reference to the following detailed description when considered in conjunction with the accompanying drawings wherein.

DETAILED DESCRIPTION OF EXEMPLARY EMBODIMENTS

Figure 2:
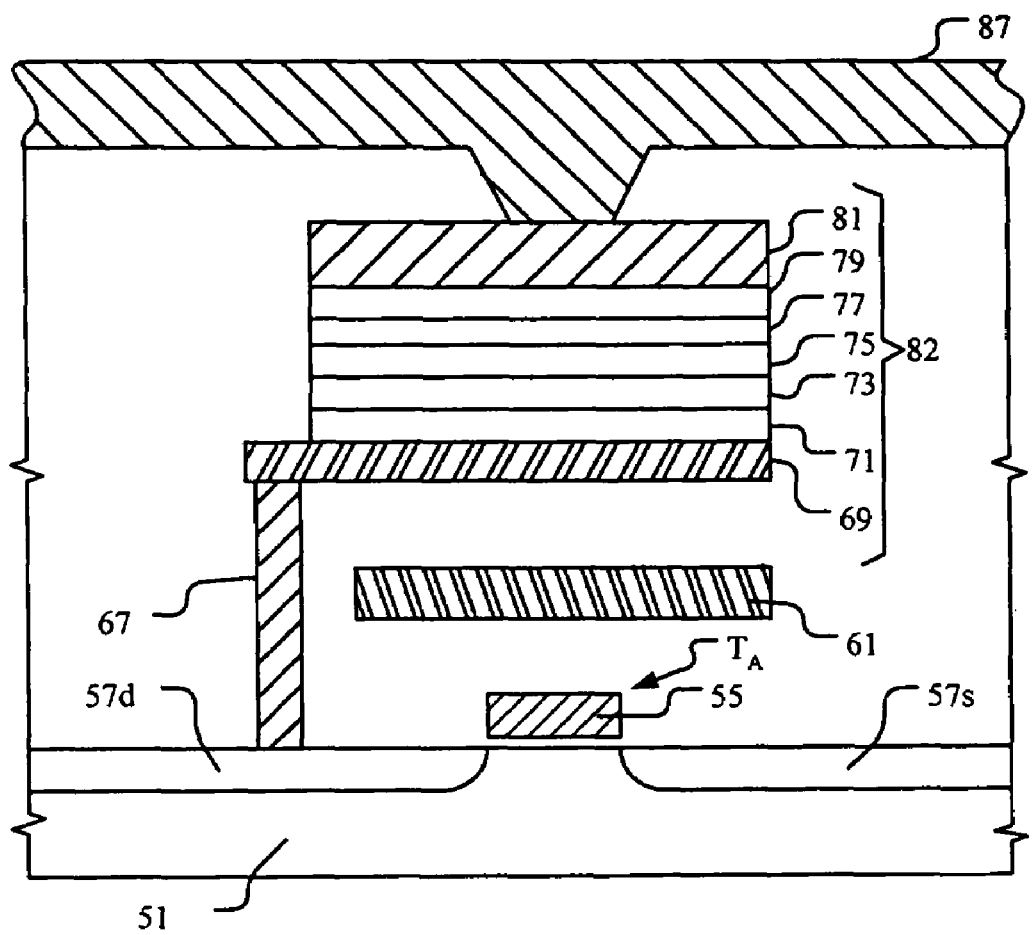
FIG. 2 is a cross-sectional view illustrating a MRAM cell according to an exemplary embodiment of the invention.

FIG. 2 is a cross-sectional view illustrating a MRAM cell according to an exemplary embodiment of the invention. As illustrated in FIG. 2, an access transistor $T_A$ is formed on a region of a semiconductor substrate 51. The access transistor $T_A$ includes a source region 57s and a drain region 57d separated by a channel region with a gate electrode 55 disposed over the channel region and configured to act as a word line. A digit line 61 is located over the access transistor $T_A$ and is arranged generally parallel to the word line.

A magnetic tunnel junction (MTJ) structure 82 is disposed above the digit line 61 and generally opposite the access transistor $T_A$. The MTJ structure 82 is a stacked structure including a bottom electrode 69, a pinning layer pattern 71, a pinned layer pattern 73, a tunneling layer pattern 75, a free layer pattern 77, a capping layer pattern 79 and a top electrode 81. The MTJ structure 82 is insulated from the digit line 61, i.e., an insulating material is disposed between the lowest layer of the MTJ structure, bottom electrode 69, and digit line 61.

The bottom electrode 69 may be electrically connected to the drain region 57d through a contact plug 67 or may be formed in direct contact with the drain region 57d. In the illustrated embodiment, the conductive layer comprising the bottom electrode 69 does not include a separate seeding layer formed between the insulating material and the conductive layer and exhibits improved surface morphology, i.e., a low surface roughness. In addition, the conductive material used to form bottom electrode 69 may have a lattice constant similar to that of the pinning layer pattern 71 in order to increase the uniformity of the crystalline structure between the bottom electrode 69 and the pinning layer pattern 71. Furthermore, the material used to form the bottom electrode 69 should exhibit sufficient adhesion to the underlying insulating material without the use of a wetting layer. A platinum group metal or a conductive platinum group metal oxide may be used to form a bottom electrode 69 directly on an insulating material that exhibits sufficient adhesion, improved surface morphology and a lattice constant generally compatible with a variety of pinning layer materials.

The platinum group metals that may be used to form the bottom electrode 69 include platinum (Pt), ruthenium (Ru), iridium (Ir), rhodium (Rh), osmium (Os), palladium (Pd) or an alloy of these metals. The platinum group metal oxides that may be used to form the bottom electrode include platinum oxide, ruthenium oxide, iridium oxide, rhodium oxide, osmium oxide, palladium oxide or a combination of two or more of these oxides. The bottom electrode may also be formed from a combination of one or more platinum group metals and the corresponding platinum group metal oxide(s).

In accord with the exemplary embodiment illustrated in FIG. 2, two bottom electrode 69 structures were formed using a layer of iridium and a layer of iridium oxide. The surface roughness of each of the bottom electrode structures was then measured using atomic force microscopy (AFM). A conventional bottom electrode structure was also formed using a titanium nitride layer after which the surface roughness was also measured by AFM. Each of the iridium, iridium oxide and titanium nitride layers were deposited using DC magnetron sputtering to form 500 Å layers. The depositions were conducted at a chamber pressure of about 5-6 mTorr and with a deposition temperature of about 100° C. for the titanium nitride layer and about 250° C. for both the iridium and iridium oxide layers. The surface measurement results for these three materials are summarized below in TABLE 1.

TABLE 1

| Bottom Electrode Material | RMS Surface Roughness (Angstroms) |
|---|---|
| Titanium Nitride | 6-7 |
| Iridium | 2-3 |
| Iridium Oxide | 2-3 |

As reflected in the surface roughness measurements reflected in TABLE 1, when used to form a bottom electrode layer, both the iridium layer and the iridium oxide layer exhibit an improved surface morphology in comparison to the conventional titanium nitride layer.

As noted above, the surface roughness of the bottom electrode affects the reliability and uniformity of the tunneling layer pattern. Additional testing was conducted in order to evaluate the impact of the improved bottom electrode surface morphology provided by the exemplary embodiments of the invention on other layers of an MTJ structure. A conventional stack structure including the sequential formation of a seed layer, a pinning layer and a pinned layer was formed on a conventional titanium nitride bottom electrode. A second stack structure including a pinning layer and pinned layer were sequentially formed on an iridium bottom electrode. The surface roughness of the pinned layers was then measured on both structures using AFM. The surface measurement results for the two pinned layers is provided below in TABLE 2.

TABLE 2

| Stacked Structure | RMS Surface Roughness of the Pinned Layer (Angstrom) |
|---|---|
| Pinned layer/Pinning layer/Seeding layer/Bottom electrode (TiN) | 9.2 |
| Pinned layer/Pinning layer/Bottom electrode (Ir) | 2.7 |

As reflected in the data presented in TABLE 2, the pinned layer formed on the stacked structure having the improved bottom electrode surface morphology according to the exemplary embodiment of the present invention exhibited similarly improved surface morphology as compared to the pinned layer formed on a conventional stacked structure.

Again referring to the exemplary embodiment illustrated in FIG. 2, as noted above the top electrode 81 is electrically connected to a bit line 87 which is arranged in a direction generally perpendicular to the word line 55.

When the MRAM cell enters the write mode, a write current is directed through digit line 61 to magnetize the material comprising the free layer pattern 77. During the writing process, the magnetization direction imposed in the free layer pattern 77 is determined by the direction of the write current through digit line 61 and will be either parallel or antiparallel to the magnetization direction maintained in the pinned layer pattern 73. When the magnetized spins in the free layer pattern 77 are arrayed in a direction parallel to the fixed spins in the pinned layer pattern 73, the tunneling layer pattern 75 will exhibit a reduced magnetic resistance. On the contrary, when the magnetized spins in the free layer pattern 77 are arrayed in a direction antiparallel to the fixed spins in the pinned layer pattern 73, the tunneling layer pattern 75 will exhibit an increased magnetic resistance. The magnetic parameters of a particular MTJ structure 82 are reflected in its hysteresis loop characteristics.

The fixed spins in the pinned layer pattern 73 are influenced by the surface roughness of the pinning layer pattern 71, i.e., the greater the surface roughness of the pinning layer pattern 71, the lower the net amount of fixed spins in the pinned layer pattern 73. This is because increasing numbers of the spins in the pinning layer pattern 71 will be arrayed upwardly or downwardly along the sloped surfaces as a result of the surface roughness. As a result, improvements in the surface roughness of the bottom electrode 69 are reflected in improvements in the hysteresis loop characteristic of the resulting MTJ structure 82.

When the MRAM enters the read mode, a sensing voltage is applied to the bit line 87, the source region 57s is grounded, and a read voltage is applied to word line 55 to turn on the access transistor $T_A$. Depending on the direction of the magnetization of the free layer pattern 77, the tunneling layer pattern 75 will exhibit a lower magnetic resistance, in which case a larger current will flow through bit line 87, or a higher magnetic resistance, in which case a smaller current will flow through bit line 87. The value of the current flowing through bit line 87 as a result of the applied sensing voltage will reflect the magnetization direction of the free layer pattern 77.

Figure 3:
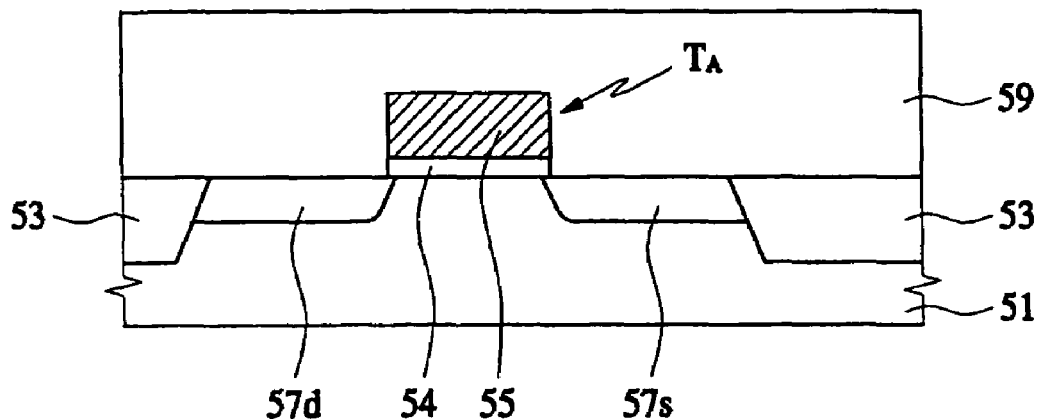
FIGS. 3-6 are cross-sectional views illustrating steps in the manufacture of a MRAM cell according to an exemplary embodiment of the invention.

FIGS. 3 through 6 are cross-sectional views illustrating a method of fabricating the MRAM cell according to an exemplary embodiment of the invention. Referring to FIG. 3, an isolation layer 53 is formed at a region of a semiconductor substrate 51. The isolation layer 53 generally surrounds and defines an active region. An access transistor $T_A$ is then formed in the active region using conventional semiconductor manufacturing processes to include a drain region 57d and a source region 57s separated by a channel region and a gate electrode 55 formed on a gate insulating layer 54 over the channel region to control the transistor and function as a word line. A first interlayer insulating layer 59 is formed on an entire surface of the substrate including the access transistor $T_A$.

Figure 4:
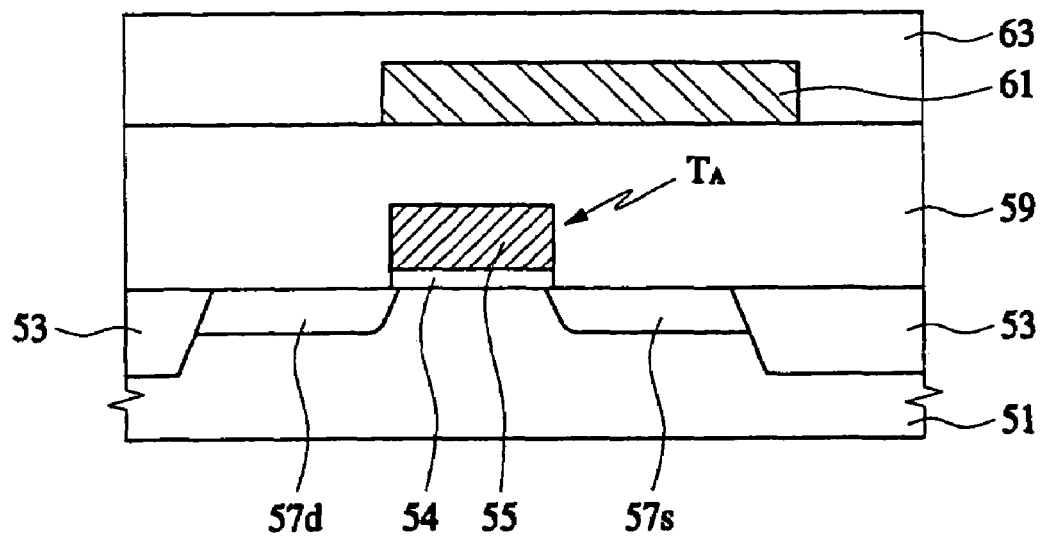

Referring to FIG. 4, a digit line 61 is formed on the first interlayer insulating layer 59. The digit line 61 is formed to be generally parallel with and positioned above the word line 55. A second interlayer insulating layer 63 is then formed on the substrate and the digit line 61.

Figure 5:
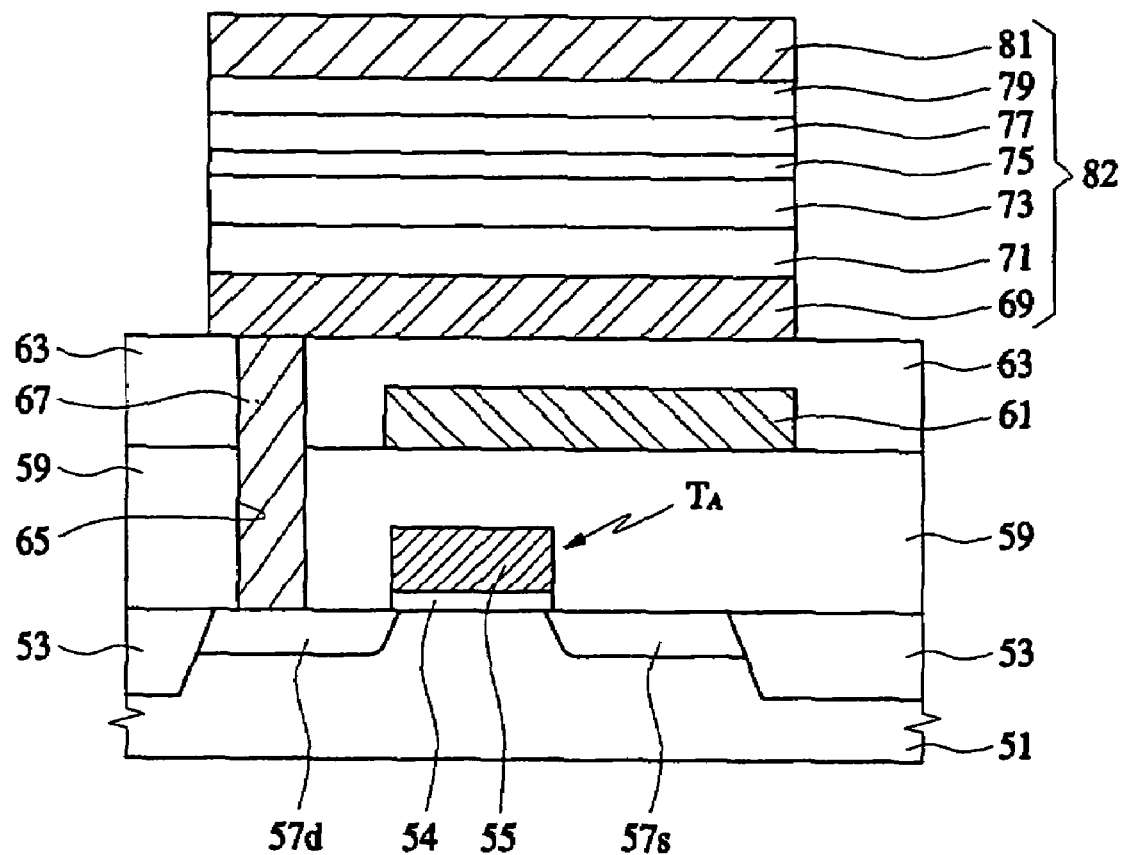

Referring to FIG. 5, the second interlayer insulating layer 63 and the first interlayer insulating layer 59 are successively patterned and etched to open a bottom electrode contact hole 65 that exposes a portion of the surface of drain region 57d. One or more conductive layers are then formed on the substrate and fill contact hole 65. The upper portion of the conductive layer is then removed, typically using a planarization process, to remove substantially all of the conductive layer and expose a top surface of the second interlayer insulating layer 63. The remaining portion of the conductive layer forms contact plug 67 in the contact hole 65. A bottom electrode layer, a pinning layer, a pinned layer, a tunneling layer, a free layer, a capping layer and a top electrode layer are sequentially formed on the surface of the substrate including the second interlayer insulating layer 63 and contact plug 67.

The bottom electrode layer may include a platinum group metal, a conductive platinum group metal oxide or a combination of a platinum group metal and a conductive platinum group metal oxide. For example, the bottom electrode layer may include platinum, ruthenium, iridium, rhodium, osmium, palladium or a combination of two or more of these metals. The bottom electrode may also include a conductive platinum group metal oxide such as platinum oxide, ruthenium oxide, iridium oxide, rhodium oxide, osmium oxide, palladium oxide or combination of two or more platinum group metal oxides. The bottom electrode layer may be formed to a range of thicknesses, but a thickness of between about 500 Å to about 1000 Å may be generally acceptable.

The pinning layer is typically formed from an anti-ferromagnetic material such as iridium-manganese (IrMn) or platinum-manganese (PtMn). The pinning layer may be formed to a range of thicknesses, but a thickness of between about 100 Å and about 200 Å may be generally acceptable.

The pinned layer is typically formed from a ferromagnetic material such as cobalt-iron (CoFe), nickel-iron (NiFe) or iron-manganese (FeMn). The pinned layer may generally be formed to a thickness of between about 50 Å and about 100 Å. The pinned layer may be formed using a variety of sputtering or chemical vapor deposition (CVD) techniques.

The tunneling layer is typically a thin layer of an insulating material such as aluminum oxide ($Al_2O_3$). If aluminum oxide is used to form the tunneling layer, the layer thickness may be between about 15 Å to about 30 Å. The tunneling layer may be formed using a variety of processes including plasma-enhanced chemical vapor deposition (PECVD), low pressure chemical vapor deposition (LPCVD), sputtering or atomic layer deposition (ALD). For example, the aluminum oxide tunneling layer may be formed by sputter depositing a thin, about 15-20 Å, aluminum layer on the pinned layer and then oxidizing the aluminum layer using an oxygen plasma to form an aluminum oxide layer of about 20 to about 30 Å. Other methods of oxidizing the aluminum layer include ion-beam oxidation and UV-stimulated $O_2$ exposure. Alternatively, an aluminum oxide layer may be formed using an ALD process.

A free layer is then typically formed on the tunneling layer using a ferromagnetic material such as cobalt-iron (CoFe), nickel-iron (NiFe), iron-manganese (FeMn) or a combination layer of NiFe and CoFe. Although the free layer may be formed to a variety of thicknesses, a thickness of about 80 Å to about 150 Å may be generally acceptable. The free layer can be formed using a variety of sputtering or chemical vapor deposition (CVD) techniques.

A capping layer may be formed from tantalum and may have a thickness of about 100 Å.

The top electrode layer, the capping layer, the free layer, the tunneling layer, the pinned layer, the pinning layer and the bottom electrode layer are then patterned and etched to form the stacked structure comprising the magnetic tunnel junction (MTJ) structure 82. As illustrated in the exemplary embodiment illustrated in FIG. 6, the MTJ structure 82 comprises a stacked structure including a bottom electrode 69, a pinning layer pattern 71, a pinned layer pattern 73, a tunneling layer pattern 75, a free layer pattern 77, a capping layer pattern 79 and a top electrode 81. The bottom electrode 69 covers and makes electrical contact with the contact plug 67 and is thereby electrically connected to the drain region 57d.

As noted above, in certain instances the conductive material used to form the bottom electrode may be used to make direct contact (not illustrated) to the drain region. In such instances, certain of the process steps necessary for the formation of a contact plug may be omitted from the process flow.

Figure 6:
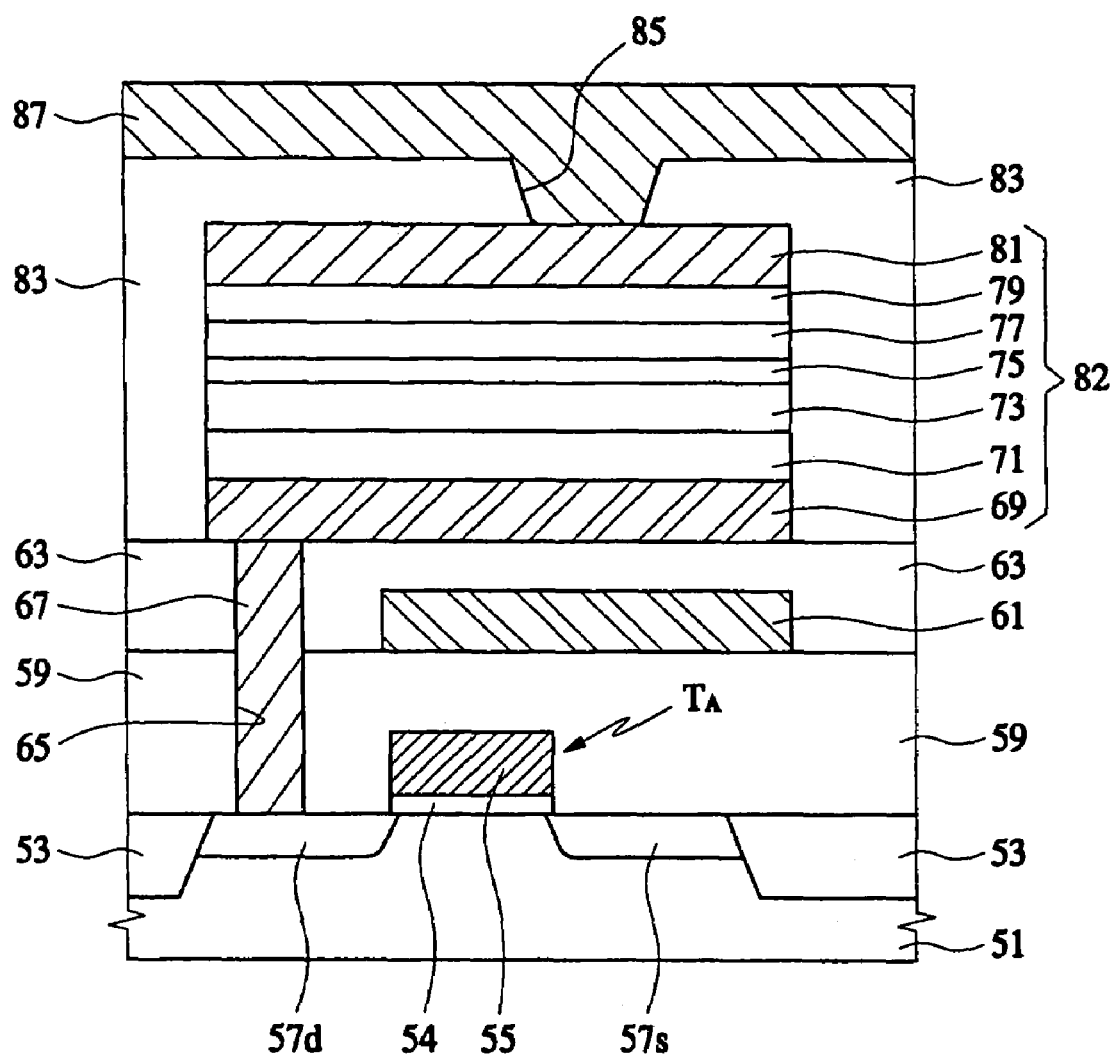

Referring to FIG. 6, a third interlayer insulating layer 83 is then formed on the entire surface of the substrate including the MTJ structure 82. The third interlayer insulating layer 83 is patterned to form a bit line contact hole 85 that exposes a portion of a top surface of the top electrode 81. A conductive layer, formed from a conductive material such as a metal or conductive metal oxide, is then formed on the substrate and in bit line contact hole 85. The conductive layer is then patterned and etched to form a bit line 87 that covers the bit line contact hole 85, is electrically connected to the top electrode 81, and is arranged to cross over the digit line 61 and the word line 55 in a generally perpendicular manner.

Figure 1:
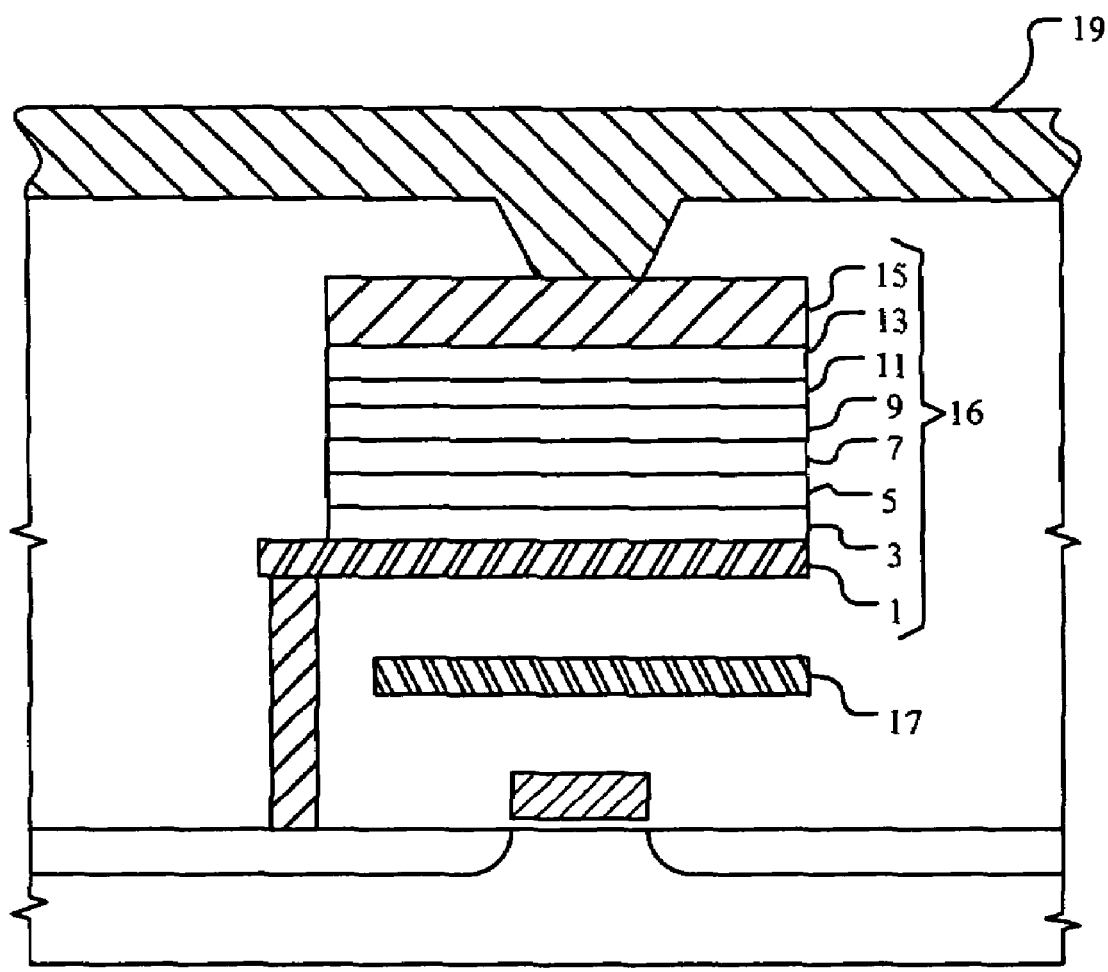
FIG. 1 provides a cross-sectional view of a conventional MRAM cell having a MTJ structure.
Figure 7:
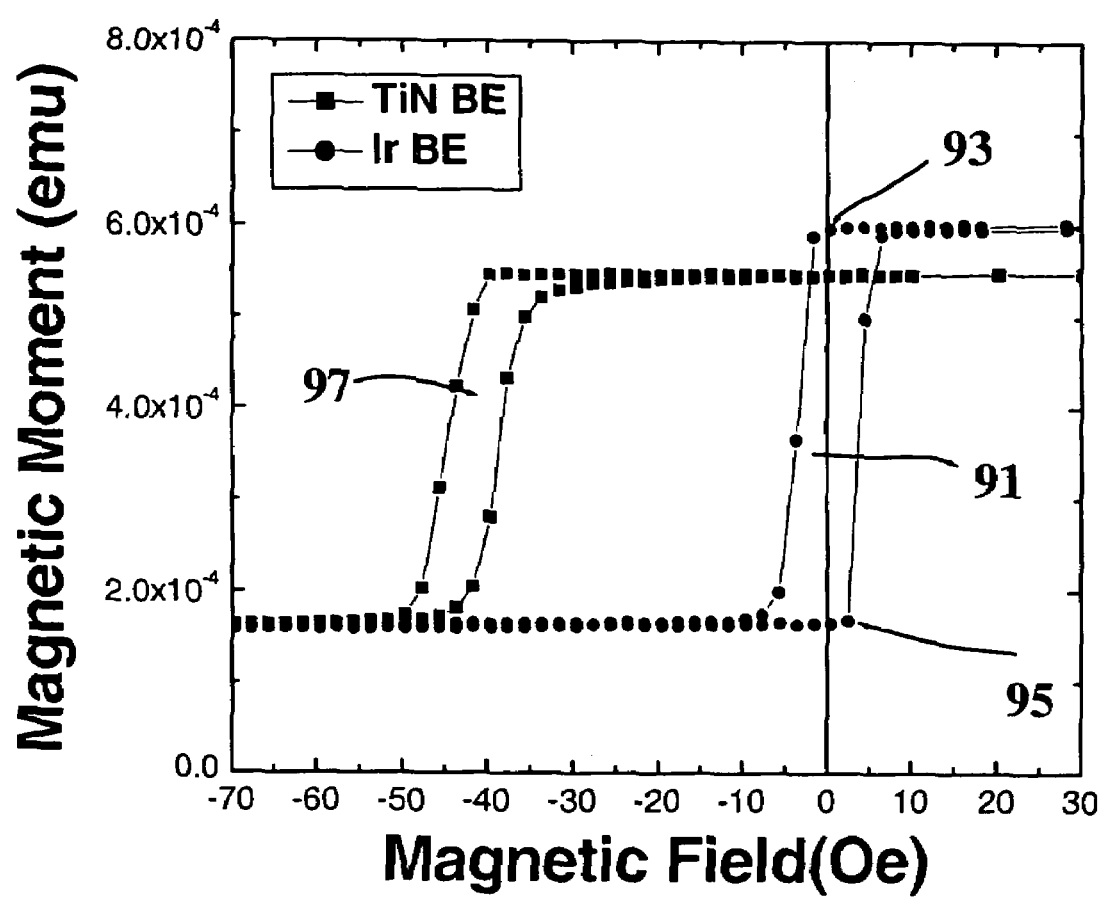
FIG. 7 is a graph illustrating the improved hysteresis loop characteristics of an MTJ structure according to an exemplary embodiment of the invention.

FIG. 7 is a graph illustrating the hysteresis loop characteristics of a MTJ structure fabricated according to an exemplary embodiment of the invention as detailed above using an iridium bottom electrode and a MTJ structure fabricated using the conventional process and materials as generally illustrated and described with respect to FIG. 1 with a titanium nitride bottom layer and a seeding layer under the pinning layer.

As indicated by the axis labels on the graph in FIG. 7, the abscissa indicates the applied magnetic field and the ordinate indicates the magnetic moment. As reflected in the data presented in FIG. 7, the hysteresis loop characteristics of the MTJ according to an exemplary embodiment of the invention form a generally parallelogram-shaped region 91 and exhibit two distinct magnetic moments 93, 95 in the absence of any applied magnetic field (Oe=0) within region 91. In addition, the difference between the higher 93 and the lower 95 values of the magnetic moment was increased relative to the magnetic moments achieved by the conventional MTJ structure. This increased difference in the magnetic moment values provides a larger sensing margin when reading the data stored in such MRAM memory cells, thereby reducing the likelihood of soft errors.

As also reflected in the graph in FIG. 7, the hysteresis loop characteristics of the MTJ structure prepared according to the conventional art 97 was shifted from the ordinate (centered at about −45 Oe) and exhibited a smaller difference between the higher and lower values for the magnetic moments. The shift seen in the hysteresis loop characteristics 97 for the conventional MTJ means that such an MTJ cannot exhibit two distinct magnetic moments in the absence of an applied magnetic field.

A MTJ structure manufactured according the exemplary examples of the invention as described above includes an improved bottom electrode that may eliminate or reduce the need for either a wetting layer below the bottom electrode or a seeding layer formed between the bottom electrode and the pinning layer. A MTJ structure manufactured according to the exemplary examples of the invention as described above includes a bottom electrode having improved surface morphology. The improved surface morphology of the bottom electrode tends to increase the number of fixed spins available in the pinned layer and improve the hysteresis loop characteristics of the resulting MTJ structure. The improved hysteresis loop characteristics of MTJ structures according to the exemplary embodiments of the invention may be suitable for use in improved MRAM cells. Exemplary embodiments of the invention, therefore, may provide improved performance and/or simplified processing for MTJ structures and MRAM devices.

Although certain exemplary embodiments of the present invention have been described, it is understood that the present invention should not be limited to these particular embodiments and that various changes and modifications can be made by one skilled in the art within the spirit and scope of the present invention as hereinafter claimed.

What is claimed is:

1. A method of forming a magnetic random access memory (MRAM) having a stacked magnetic tunnel junction (MTJ) structure comprising:

forming an insulating layer;

forming a bottom electrode layer on the insulating layer, the bottom electrode layer having an as-formed RMS surface roughness of less than 5 Å, and composed of a multilayer stack structure including a first layer of a conductor selected from the group consisting of platinum, ruthenium, iridium, rhodium, osmium and palladium and a second layer of an oxide of the conductor; and completing the MTJ structure.

2. A method of forming a magnetic random access memory (MRAM) having a stacked magnetic tunnel junction (MTJ) structure according to claim 1, wherein the completing the MTJ structure comprises:

forming a pinning layer on the bottom electrode layer;

forming a pinned layer on the pinning layer;

forming a tunneling layer on the pinned layer;

forming a free layer on the tunneling layer;

forming a top electrode layer on the free layer;

and etching the top electrode layer, the free layer, the tunneling layer, the pinned layer, the pinning layer and the bottom electrode layer to form the stacked magnetic tunnel junction (MTJ) structure.

3. A method of forming a magnetic random access memory (MRAM) having a stacked magnetic tunnel junction (MTJ) structure according to claim 2, wherein:

the pinning layer includes an anti-ferromagnetic material selected from the group consisting of iridium manganese (IrMn) and platinum manganese (PtMn);

the pinned layer includes a ferromagnetic material selected from the group consisting of cobalt iron (CoFe), nickel iron (NiFe) and iron manganese (FeMn);

the tunneling layer includes aluminum oxide ($Al_2O_3$);

the free layer includes a ferromagnetic material selected from the group consisting of cobalt iron (CoFe), nickel iron (NiFe) and iron manganese (FeMn) and combinations thereof; and the top electrode layer includes a conductive material.

4. A method of forming a magnetic random access memory (MRAM) having a stacked magnetic tunnel junction (MTJ) structure according to claim 1, wherein:

the magnetic tunnel junction structure exhibits a hysteresis loop having a first magnetic moment and a second magnetic moment in the absence of a magnetic field, the first magnetic moment being greater than the second magnetic moment.

5. A method of forming a magnetic random access memory (MRAM) having a stacked magnetic tunnel junction (MTJ) structure according to claim 4, wherein:

the ratio of the first magnetic moment and the second magnetic moment is at least 2:1.

6. A method of forming a magnetic random access memory (MRAM) having a stacked magnetic tunnel junction (MTJ) structure according to claim 1, wherein the completing the MTJ structure comprises:

forming a seeding layer on the bottom electrode layer;

forming a pinning layer on the seeding layer; and forming a pinned layer on the pinning layer.

* * * * *